United States Patent [19]
Ebner

[11] Patent Number: 5,218,406
[45] Date of Patent: Jun. 8, 1993

[54] MEMORY CARD FEATURES

[75] Inventor: Fritz F. Ebner, Rochester, N.Y.

[73] Assignee: Xerox Corporation, Stamford, Conn.

[21] Appl. No.: 719,856

[22] Filed: Jun. 24, 1991

[51] Int. Cl.⁵ .......................................... G03G 21/00
[52] U.S. Cl. ........................................ 355/205; 371/7; 371/16.4
[58] Field of Search ........................ 355/200, 203–209; 371/7, 8.1, 16.4

[56] References Cited

U.S. PATENT DOCUMENTS

| | | | |
|---|---|---|---|
| 3,751,582 | 8/1973 | Wernikoff et al. | 178/6 |
| 4,521,847 | 6/1985 | Ziehm et al. | 371/7 X |
| 4,580,232 | 4/1986 | Dugan et al. | |
| 4,719,516 | 1/1988 | Nagashima | 358/780 |
| 4,821,107 | 4/1989 | Naito et al. | 358/256 |
| 4,947,397 | 8/1990 | Sobel et al. | 371/16.4 |
| 4,994,853 | 2/1991 | Fukuchi et al. | 355/208 |
| 4,998,195 | 3/1991 | Ito et al. | 355/204 X |
| 5,030,990 | 7/1991 | Iwaki et al. | 355/204 |
| 5,045,880 | 9/1991 | Evanitsky et al. | 355/209 X |
| 5,061,958 | 10/1991 | Bunker | 355/209 |
| 5,077,581 | 12/1991 | Suzuki | 355/209 X |
| 5,081,699 | 1/1992 | Filion et al. | 355/206 X |
| 5,115,273 | 5/1992 | Ujiie et al. | 355/209 |

Primary Examiner—R. L. Moses
Attorney, Agent, or Firm—Ronald F. Chapuran

[57] ABSTRACT

A technique for providing predetermined diagnostic procedures to an operator, the diagnostic procedures being selectively stored on a portable memory device of an image processing apparatus including the steps of: preparing a portable memory device with predetermined diagnostic procedures, permitting a given operator access to said portable memory device with predetermined diagnostic procedures, and providing access to said portable memory device by said given operator. Also included is the process of initiating a transfer of data from the memory of the image processing apparatus to the portable memory device, and recognizing a controller crash condition, and responding to the controller crash condition to initiate the transfer of data from the random access memory of the image processing apparatus to the portable memory device.

11 Claims, 8 Drawing Sheets

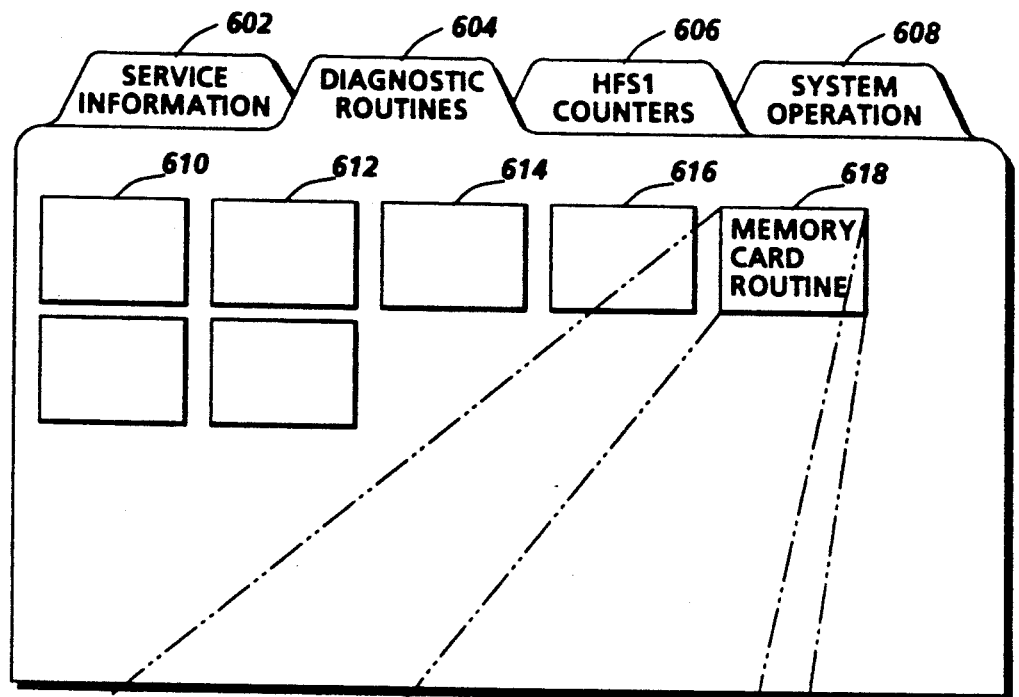
FIG. 7
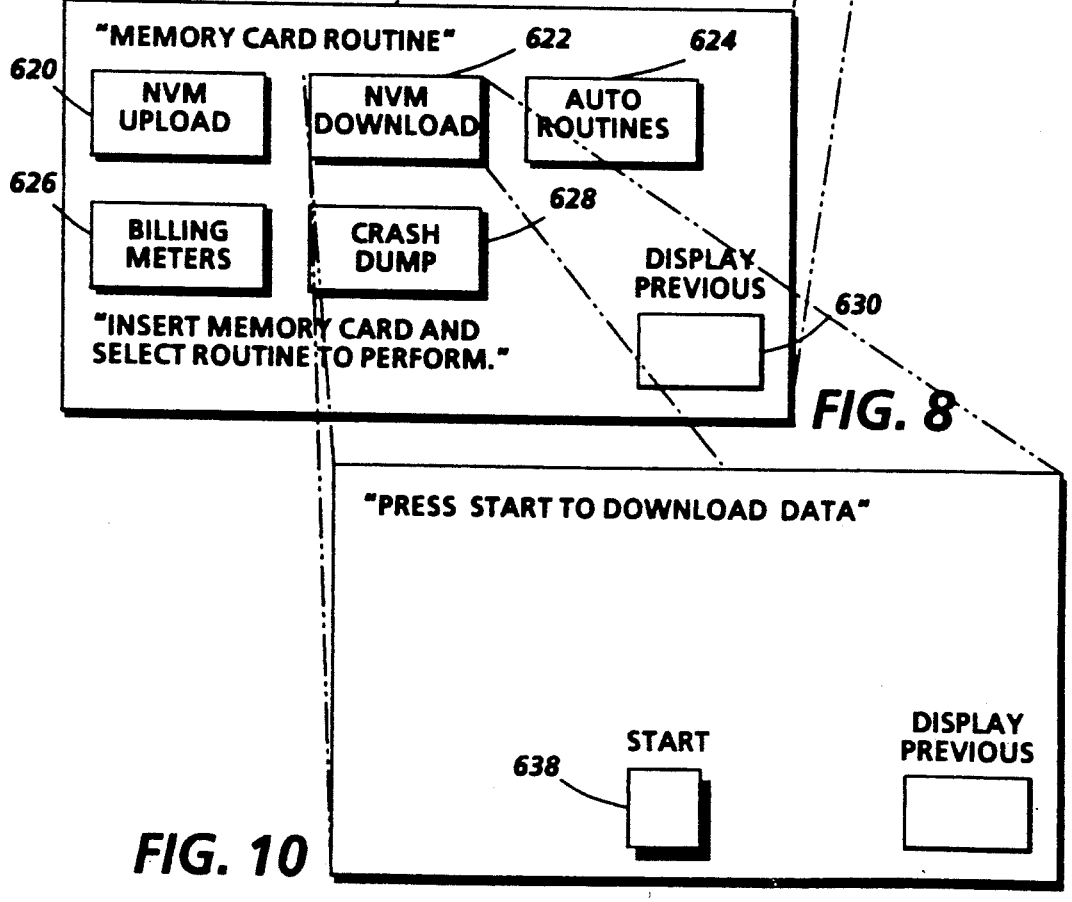
FIG. 8
FIG. 10

MEMORY CARD FEATURES

BACKGROUND OF THE INVENTION

The invention relates to a system for diagnostics of reproduction machines such as copiers and printers, and more particularly, to the use of memory cards for such diagnostics.

As reproduction machines such as copiers and printers become more complex and versatile in the jobs they can do, the user interface between the machine and the operator or user must necessarily be expanded if full and efficient utilization of the machine is to be realized. A suitable interface must not only provide the controls, displays, and messages necessary to activate and program the machine but must also provide the mechanism to be able to monitor and maintain the machine, in particular, under a variety of conditions and in response to a wide difference level of skill of operators.

At one extreme is the dedicated user; that is, the user whose principal task is to run copying jobs and/or supervising others who do. This type of operator typically requires extensive and costly training in order to become fully skilled in all the potential programming and diagnostic possibilities and operating situations that are possible. At the other extreme is the casual user whose principal task is running copies and doing relatively simple jobs such as jam clearance, consumable replacement, and the like. This latter type of operator requires only minimal training, and typically comprises the smallest group of operators for the machine. Intertwined with the need to accommodate operators of these and other skill levels and training is the need to maximize productivity and ease of use while enabling successful operation of the machine.

Unlike simple copiers, in which the only visible operator controls may be a copy count selector for the number of copies, and "ON", "OFF", and "START" buttons, a modern sophisticated copier may present the operator with a large and confusing display of additional switches, buttons, dials, lights, and instructions, including various operator diagnostic and recovery routines that may be available. To fully utilize the capabilities of the copying machine it may be necessary for the operator to appropriately actuate various combinations of these controls before the copying can commence or be successfully completed.

It is a feature of the present invention to overcome various of the above and other related problems and to thereby make easier, and encourage, the utilization of the full capabilities of a modern copying apparatus by a wide range of operators, both trained and untrained and to simplify the diagnostic and machine trouble shooting procedures.

The prior art is replete with various user interface systems. For example, the Xerox 5700 Electronic Printing System incorporates a touch control CRT screen providing button, key, and window images on the screen combined with text to give concise instructions to the operator. This system accepts magnetic cards, cassettes, and disks that store the documents to be printed and also the magnetic media can store control information to specify the output format for printing or to invoke special features such as merging or interleaving. The system software translates the coded data, formats the page, and generates the hard copy locally, or the system can transmit the data via a communication link to remote 5700 printing sites.

U.S. Pat. No. 4,821,107 to Naito et al. discloses a multifunctional imaging apparatus wherein an IC memory card is used to store information. Three types of memory cards are shown for storing programs. See Col. 4, lines 34-55. A method of reading and writing to/from a memory card is shown. Each mode of operation (copier, facsimile and printer) has an associated memory card which activates the proper keys on a liquid crystal display. See Col. 6, lines 19-40. User definable set-up modes can be written into a memory card and later read out. See Col. 6, line 46-Col. 7, line 25.

U.S. Pat. No. 4,719,516 to Nagashima discloses an imaging apparatus wherein a detachable non-volatile bubble memory is shown. The memory can be used to store print jobs as well as billing information. See Col. 3, lines 11-26. Multiple detachable memories can be used to provide various storage facilities including a self-diagnosis program. See Co. 5, lines 1-35.

U.S. Pat. No. 3,751,582 to Wernikoff et al. discloses a stored program facsimile control system wherein a modem is used to program a particular mode. A detachable memory is shown for reading a stored program. See Col. 3, lines 64-66. A method of setting-up a device during power-up is shown. See Col. 4, lines 3-50.

A difficulty with the prior art systems is the lack of a quick, convenient method of gleaning valuable memory data from a machine that is on test or in the field. Another difficulty is the need to manually record data that is unique to a given machine, for example, at initialization. This process requires a significant amount of time which can be circumvented only by removing the memory board from the machine to be reloaded. Another difficulty is often the need to summon a technical representative to service the machine when in some instances an operator may be able to properly service the machine. Another difficulty in the prior art is often the inability to capture valuable crash data after the system crashes and automatically reboots, particularly in a design or development environment. It is an object of the present invention, therefore, to provide a new and improved technique to save and capture valuable crash data as well as machine specific memory data. It is still another object of the present invention to be able to selectively provide preprogrammed diagnostic routines such as process control setups, copy handling calibration, test pattern generation, and magnification adjustment to appropriate operators. Other advantages of the present invention will become apparent as the following description proceeds, and the features characterizing the invention will be pointed out with particularity in the claims annexed to and forming a part of this specification.

SUMMARY OF THE INVENTION

Briefly, the present invention is concerned with a technique for providing predetermined diagnostic procedures to an operator, the diagnostic procedures being selectively stored on a portable memory device of an image processing apparatus including the steps of: preparing a portable memory device with predetermined diagnostic procedures, permitting a given operator access to said portable memory device with predetermined diagnostic procedures, and providing access to said portable memory device by said given operator. Also included is the process of initiating a transfer of data from the memory of the image processing apparatus to the portable memory device, and recognizing a controller crash condition, and responding to the controller crash condition to initiate the transfer of data from the random access memory of the image processing apparatus to the portable memory device.

For a better understanding of the present invention, reference may be had to the accompanying drawings wherein the same reference numerals have been applied to like parts and wherein:

DETAILED DESCRIPTION OF THE DRAWINGS

FIG. 10 is a front view of the touch monitor screen depicting a NVM download in accordance with the present invention;

While the present invention will hereinafter be described in connection with a preferred embodiment thereof, it will be understood that it is not intended to limit the invention to that embodiment. On the contrary, it is intended to cover all alternatives, modifications, and equivalents, as may be included within the spirit and scope of the invention.

DETAILED DESCRIPTION OF THE PREFERRED EMBODIMENT

Figure 1:
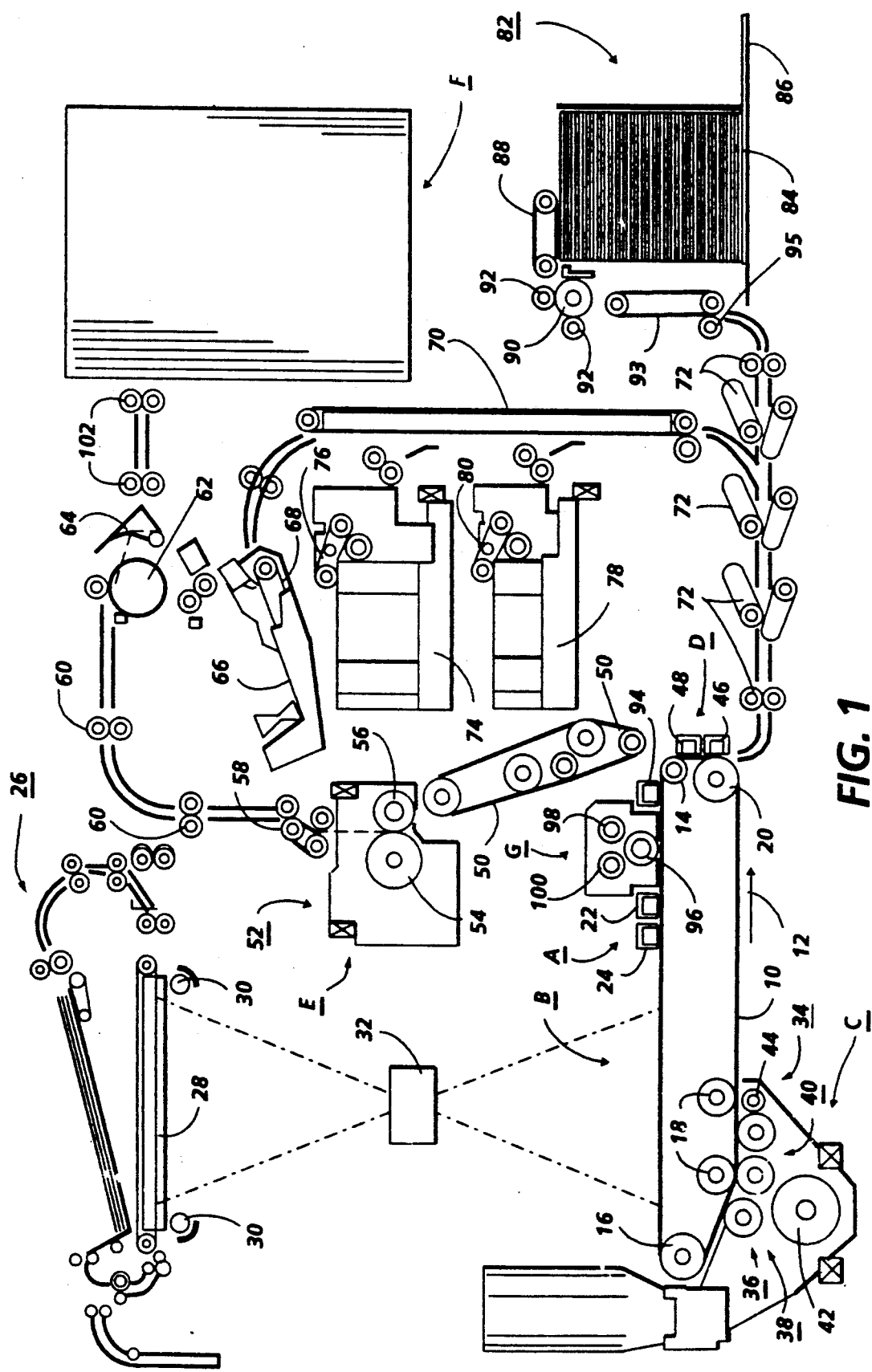
FIG. 1 is a schematic elevational view depicting various operating components and subsystems of the machine shown in FIG. 1.

For a general understanding of the features of the present invention, reference is made to the drawings. In the drawings, like reference numerals have been used throughout to identify identical elements. Referring to FIG. 1, there is shown an electrophotographic reproduction machine composed of a plurality of programmable components and subsystems which cooperate to carry out the copying or printing job programmed through the touch dialogue User Interface (U.I.) of the present invention. It will become evident from the following discussion that the touch dialogue U.I. of the present invention may be employed in a wide variety of devices and is not specifically limited in its application to the particular embodiment depicted herein.

The machine employs a photoconductive belt 10. Belt 10 is entrained about stripping roller 14, tensioning roller 16, idler rollers 18, and drive roller 20. Drive roller 20 is rotated by a motor coupled thereto by suitable means such as a belt drive. As roller 20 rotates, it advances belt 10 in the direction of arrow 12 through the various processing stations disposed about the path of movement thereof.

Initially, the photoconductive surface of belt 10 passes through charging station A where two corona generating devices, indicated generally by the reference numerals 22 and 24 charge photoconductive belt 10 to a relatively high, substantially uniform potential. Next, the charged photoconductive belt is advanced through imaging station B. At imaging station B, a document handling unit 26 sequentially feeds documents from a stack of documents in a document stacking and holding tray into registered position on platen 28. A pair of Xenon flash lamps 30 mounted in the optics cavity illuminate the document on platen 28, the light rays reflected from the document being focused by lens 32 onto belt 10 to expose and record an electrostatic latent image on photoconductive belt 10 which corresponds to the informational areas contained within the document currently on platen 28. After imaging, the document is returned to the document tray via a simplex path when either a simplex copy or the first pass of a duplex copy is being made or via a duplex path when a duplex copy is being made.

The electrostatic latent image recorded on photoconductive belt 10 is developed at development station C by a magnetic brush developer unit 34 having three developer rolls 36, 38 and 40. A paddle wheel 42 picks up developer material and delivers it to the developer rolls 36, 38. Developer roll 40 is a cleanup roll while a magnetic roll 44 is provided to remove any carrier granules adhering to belt 10.

Following development, the developed image is transferred at transfer station D to a copy sheet. There, the photoconductive belt 10 is exposed to a pre-transfer light from a lamp (not shown) to reduce the attraction between photoconductive belt 10 and the toner powder image. Next, a corona generating device 46 charges the copy sheet to the proper magnitude and polarity so that the copy sheet is tacked to photoconductive belt 10 and the toner powder image attracted from the photoconductive belt to the copy sheet. After transfer, corona generator 48 charges the copy sheet to the opposite polarity to detack the copy sheet from belt 10.

Following transfer, a conveyor 50 advances the copy sheet bearing the transferred image to fusing station E where a fuser assembly, indicated generally by the reference numeral 52 permanently affixes the toner powder image to the copy sheet. Preferably, fuser assembly 52 includes a heated fuser roller 54 and a pressure roller 56 with the powder image on the copy sheet contacting fuser roller 54.

After fusing, the copy sheets are fed through a decurler 58 to remove any curl. Forwarding rollers 60 then advance the sheet via duplex turn roll 62 to gate 64 which guides the sheet to either finishing station F or to duplex tray 66, the latter providing an intermediate or buffer storage for those sheets that have been printed on one side and on which an image will be subsequently printed on the second, opposed side thereof. The sheets are stacked in duplex tray 66 face down on top of one another in the order in which they are copied.

To complete duplex copying, the simplex sheets in tray 66 are fed, in seriatim, by bottom feeder 68 back to transfer station D via conveyor 70 and rollers 72 for transfer of the second toner powder image to the opposed sides of the copy sheets. The duplex sheet is then fed through the same path as the simplex sheet to be advanced to finishing station F.

Copy sheets are supplied from a secondary tray 74 by sheet feeder 76 or from the auxiliary tray 78 by sheet feeder 80. Sheet feeders 76, 80 are friction retard feeders utilizing a feed belt and take-away rolls to advance successive copy sheets to transport 70 which advances the sheets to rolls 72 and then to transfer station D.

A high capacity feeder 82 is the primary source of copy sheets. Tray 84 of feeder 82, which is supported on an elevator 86 for up and down movement, has a vacuum feed belt 88 to feed successive uppermost sheets from the stack of sheets in tray 84 to a take away drive roll 90 and idler rolls 92. Rolls 90, 92 guide the sheet onto transport 93 which in cooperation with idler roll 95 and rolls 72 move the sheet to transfer station station D.

After transfer station D, photoconductive belt 10 passes beneath corona generating device 94 which charges any residual toner particles remaining on belt 10 to the proper polarity. Thereafter, a pre-charge erase lamp (not shown), located inside photoconductive belt 10, discharges the photoconductive belt in preparation for the next charging cycle. Residual particles are removed from belt 10 at cleaning station G by an electrically biased cleaner brush 96 and two de-toning rolls 98 and 100.

The various functions of the machine are regulated by a controller 114 which preferably comprises one or more programmable microprocessors. The controller provides a comparison count of the copy sheets, the number of documents being recirculated, the number of copy sheets selected by the operator, time delays, jam corrections, etc. As will appear, programming and operating control over machine 5 is accomplished through the user interface. Operating and control information, job programming instructions, etc. are stored in a suitable memory which includes both ROM and RAM memory types, the latter being also used to retain jobs programmed through the user Interface. And while a single memory is illustrated, it is understood that the memory may comprise a series of discrete memories. Conventional sheet path sensors or switches may be utilized to keep track of the position of the documents and the copy sheets. In addition, the controller regulates the various positions of the gates depending upon the mode of operation selected.

Figure 2:
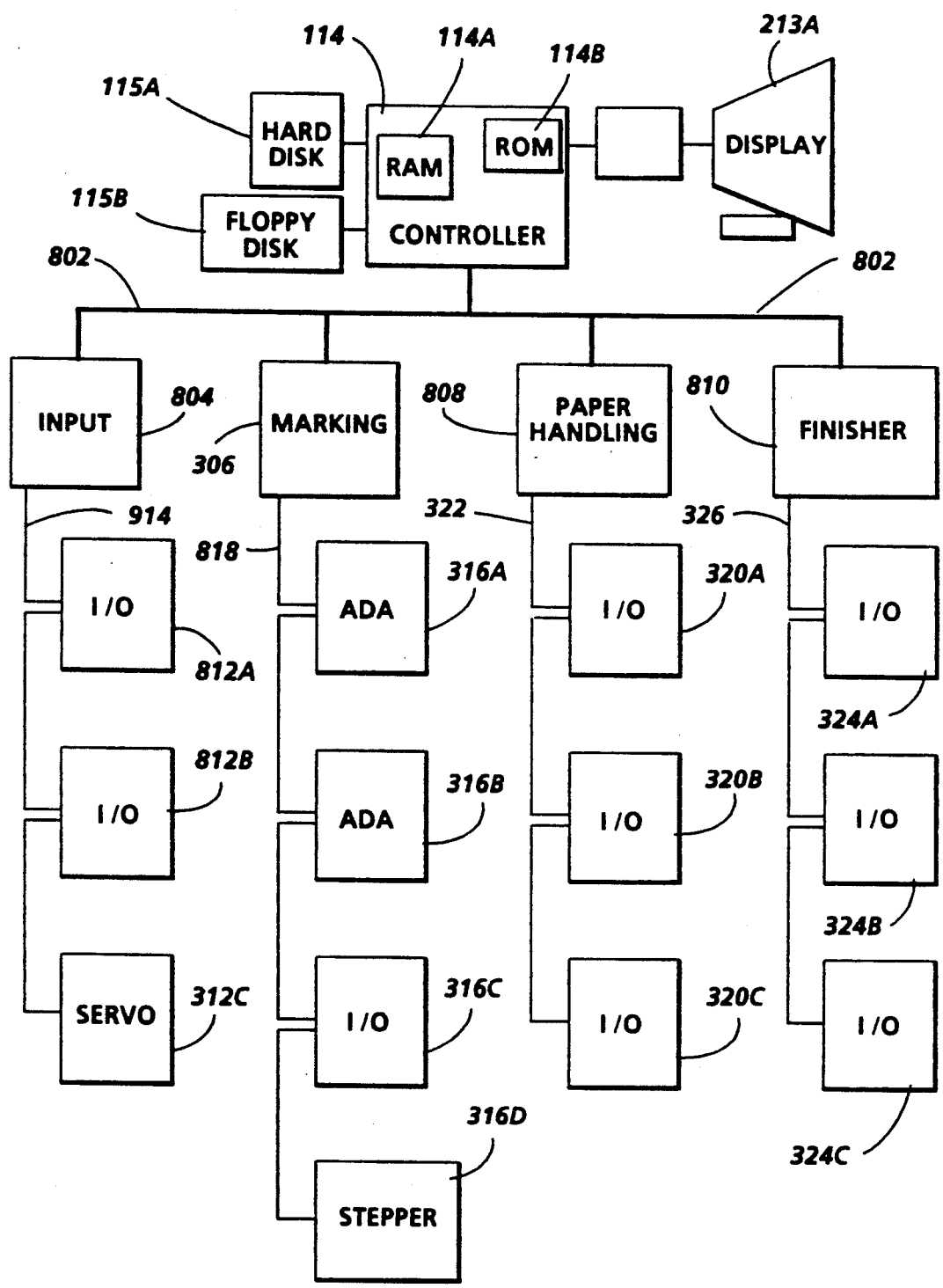
FIG. 2 is a more detailed block diagram of the operating control system of FIG. 3.

With reference to FIG. 2, the memory includes a hard or rigid disk drive 115A and a floppy disk drive 115B connected to Controller 114. In a preferred embodiment, the rigid disks are two platter, four head disks with a formatted storage capacity of approximately 20 megabytes. The floppy disks are 3.5 inch, dual sided micro disks with a formatted storage capacity of approximately 720 kilobytes. Preferably, all of the control code and screen display information for the machine is loaded from the rigid disk at machine power up. Changing the data that gets loaded into the machine for execution can be done by exchanging the rigid disk in the machine 5 for another rigid disk with a different version of data or by modifying the contents of the current rigid disk by transferring data from one or more floppy disks onto the rigid disk using the floppy disk drive built into the machine 5. Suitable display 213A of the user interface is also connected to Controller 114 as well as a shared line system bus 302.

The shared line system bus 802 interconnects a plurality of core printed wiring boards including an input station board 804, a marking imaging board 806, a paper handling board 808, and a finisher/binder board 810. Each of the core printed wiring boards is connected to local input/output devices through a local bus. For example, the input station board 804 is connected to digital input/output boards 812A and 812B and servo board 812C via local bus 814. The marking imaging board 806 is connected to analog/digital/analog boards 816A, 816B, digital input/output board 816C, and stepper control board 816D through local bus 818. In a similar manner, the paper handling board 808 connects digital input/output boards 820A, B and C to local bus 822, and finisher/binder board 810 connects digital input/output boards 824A, B and C to local bus 826.

Figure 3:
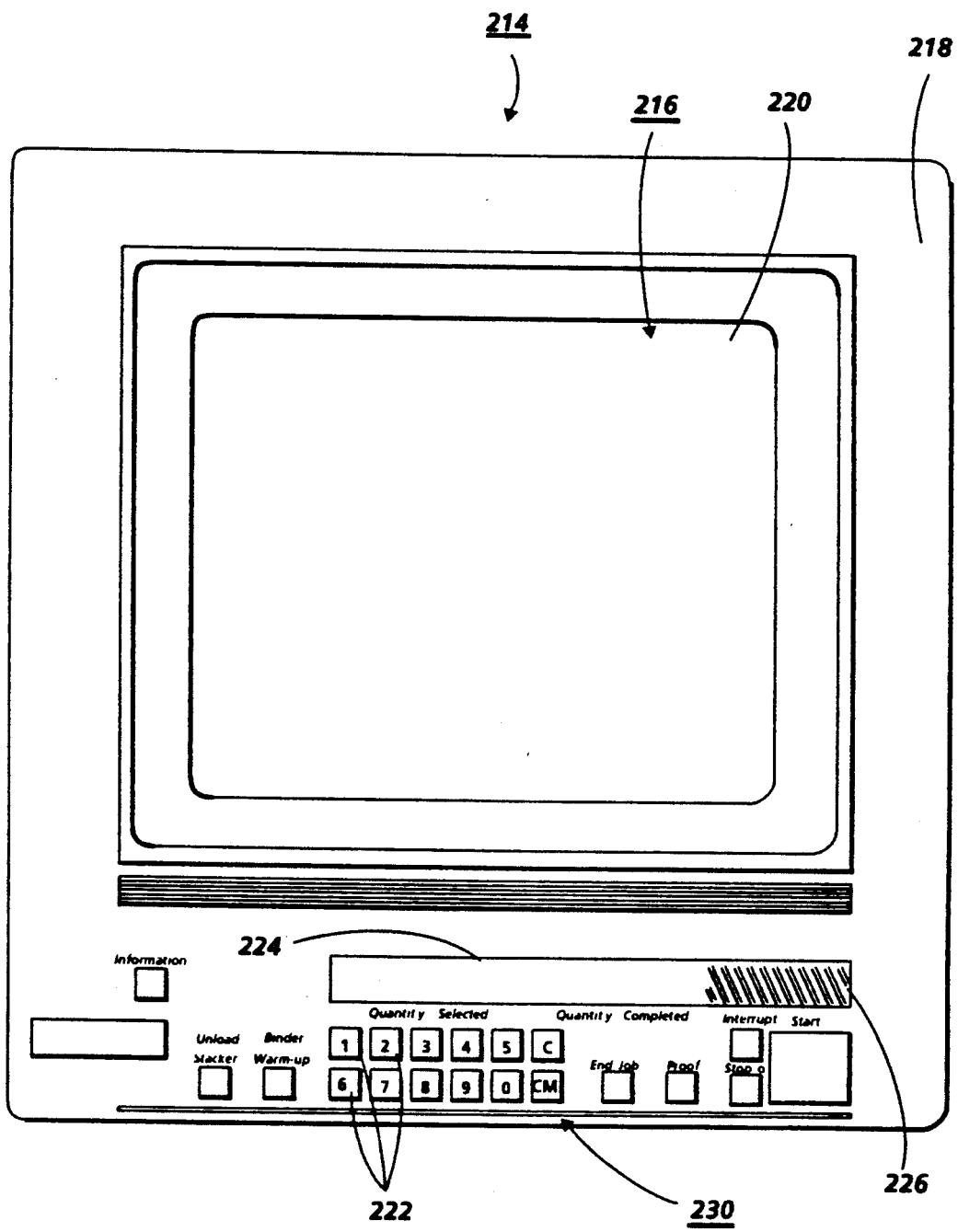
FIG. 3 is a front view of the U.I. color touch monitor showing the soft button display screen and hard button control panel.

Referring to FIG. 3, there is shown the color touch monitor 214 for the touch dialogue of the present invention. As will appear, monitor 214 provides an operator user interface with hard and soft touch control buttons enabling communication between operator and machine 10. Monitor 214 comprises a suitable color cathode ray tube 216 of desired size and type having a peripheral framework forming a decorative bezel 218 thereabout. Bezel 218 frames a rectangular video display screen 220 on which soft touch buttons in the form of icons or pictograms and messages are displayed as will appear together with a series of hard control buttons 222 and 10 seven segment displays 224 therebelow. Displays 224 provide a display for copy "Quantity Selected", copy "Quantity Completed", and an area 226 for other information.

Hard control buttons 222 comprise "0-9" buttons providing a keypad 230 for programming copy quantity, code numbers, etc.; a clear button "C" to reset display 224; a "Start" button to initiate print; a clear memory button "CM" to reset all dialogue mode features to default and place a "1" in the least significant digit of display 224; an "Unload Stacker" button requesting transfer of the contents of stacker 128; a "Stop" button to initiate an orderly shutdown of machine 5; a "Binder Warm-up" button to initiate warm-up of binder 126; an "Interrupt" button to initiate a job interrupt; a "Proof" button to initiate making of a proof copy; an "End Job" button to end the current job; and an "i" button to initiate a request for information.

Figure 4:
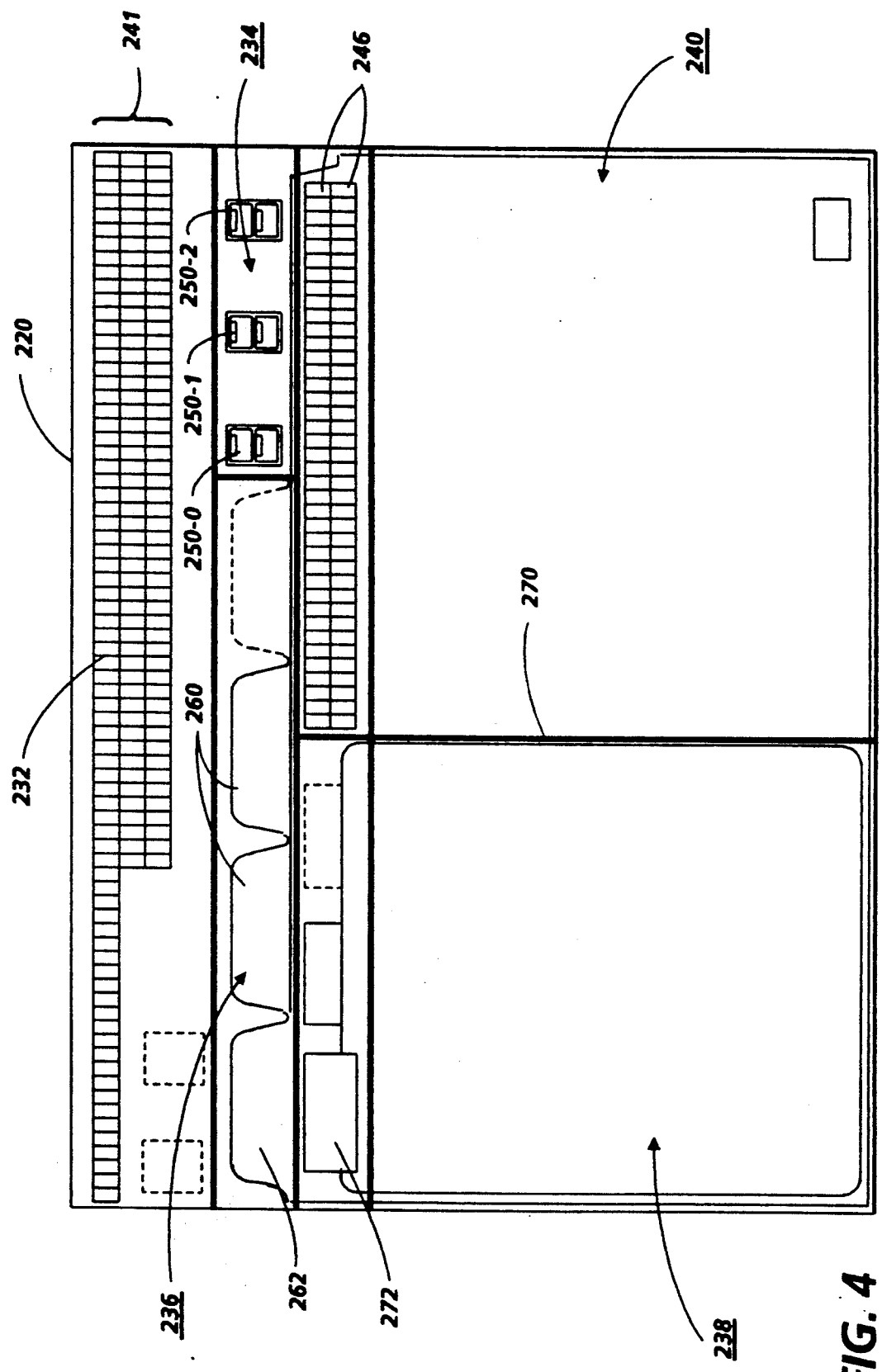
FIG. 4 is a front view of the touch monitor screen with the principal elements of the soft touch dialogue displayed.

Referring now to FIG. 4, for dialogue purposes, screen 220 of monitor 214 is separated into five basic display areas, identified as a message area 232, a dialogue mode selection area 234, a dialogue pathway selection area 236, a scorecard selection area 238, and a work selection area 240.

Message area 232 consists of 3 lines 241 located at the top of screen 220. In addition, two programming conflict message lines 246 are provided in work selection area 240. The dialogue mode selection area 234 comprises an active area containing certain top level dialogue mode controls available to the operator. The mode controls are soft touch buttons 250-0, 250-1, and 250-2 in the form of icons representing file cabinets located on the right side of the screen 220 directly below message area 232.

The dialogue pathway selection area 236 and the scorecard selection area 238 basically simulate a card within a card filing system with primary dialogue pathway file folders 260 and secondary file cards, the latter being referred to as scorecards 270. As will appear, scorecards 270 provide additional programming pathway options. File folders 260 and scorecards 270 are arranged in overlaying relation one in front of the other. The dialogue pathway file folders 260, which are located beneath message area 232 and which extend up into the dialogue mode area 234, each have an outwardly projecting touch tab 262 along the top edge identifying the dialogue pathway represented by the folder, as for example STANDARD, FANFOLD, OVERSIZED, etc. To allow the file folders 260 to be distinguished from one another without the need to reshuffle the folders each time it is desired to display a folder hidden behind the folder currently displayed, each tab 262 is offset from the other so that tabs 262 are always visible whatever folder is displayed.

Scorecard selection area 238 appears in the lower left corner of screen 220 beneath dialogue selection area 234 and extends to the border of work selection area 240. Scorecard selection area 238 contains a file of scorecards 270 which present the features (first level program selections) available with each of the dialogue pathway file folders 260. As seen in FIG. 17 for example, area 238 displays the features (first level program selections) resident with the currently selected scorecard, such selections remaining at previously selected options until either timeout or the "CM" button (FIG. 5) is pressed. Two or three scorecards 270 are typically provided, depending on the dialogue pathway file folder 260 selected. Scorecards 270 each comprise a relatively small file card arranged in overlaying relation to one another so as to simulate a second but smaller card file. Each scorecard 270 has a touch tab 272 displaying the programming pathway options available with the scorecard, such as PROGRAM, EXCEPTION, etc. Scorecard tabs 272 are offset from one another to enable the identity of each scorecard to be determined whatever its position in the scorecard file. Additionally, scorecard tabs 272 are shaped different than the dialogue pathway file folder tabs 262 to prevent confusion.

Work selection area 240 appears in the lower right portion of screen 220, area 240 being beneath the dialogue pathway area 236 and extending from the edge of scorecard selection area 238 to the right side of screen 220. The top two lines 246 of the work selection area 240 are reserved for programming conflicts and prompts with the remaining area used for displaying the feature options (second level program selections) available with the first level program selection that is touched on the scorecard currently selected. As will appear, the operator can scan and make a selection within the work area or pick another scorecard item.

In order for the soft touch buttons (i.e., icons) on screen 220 to provide information regarding both their current selection state and their current status, a display convention is provided that will allow the operator to quickly scan the display and determine current feature selections. Unselected features that are selectable are indicated by an outlined icon with a shadowed background while selected features that are selectable are indicated by a color filled icon with a shadowed background. Unselected features that are not selectable are indicated by an outlined icon without a shadowed background while selected features that are not selectable are indicated by a color filled icon without a shadowed background.

Figure 5:
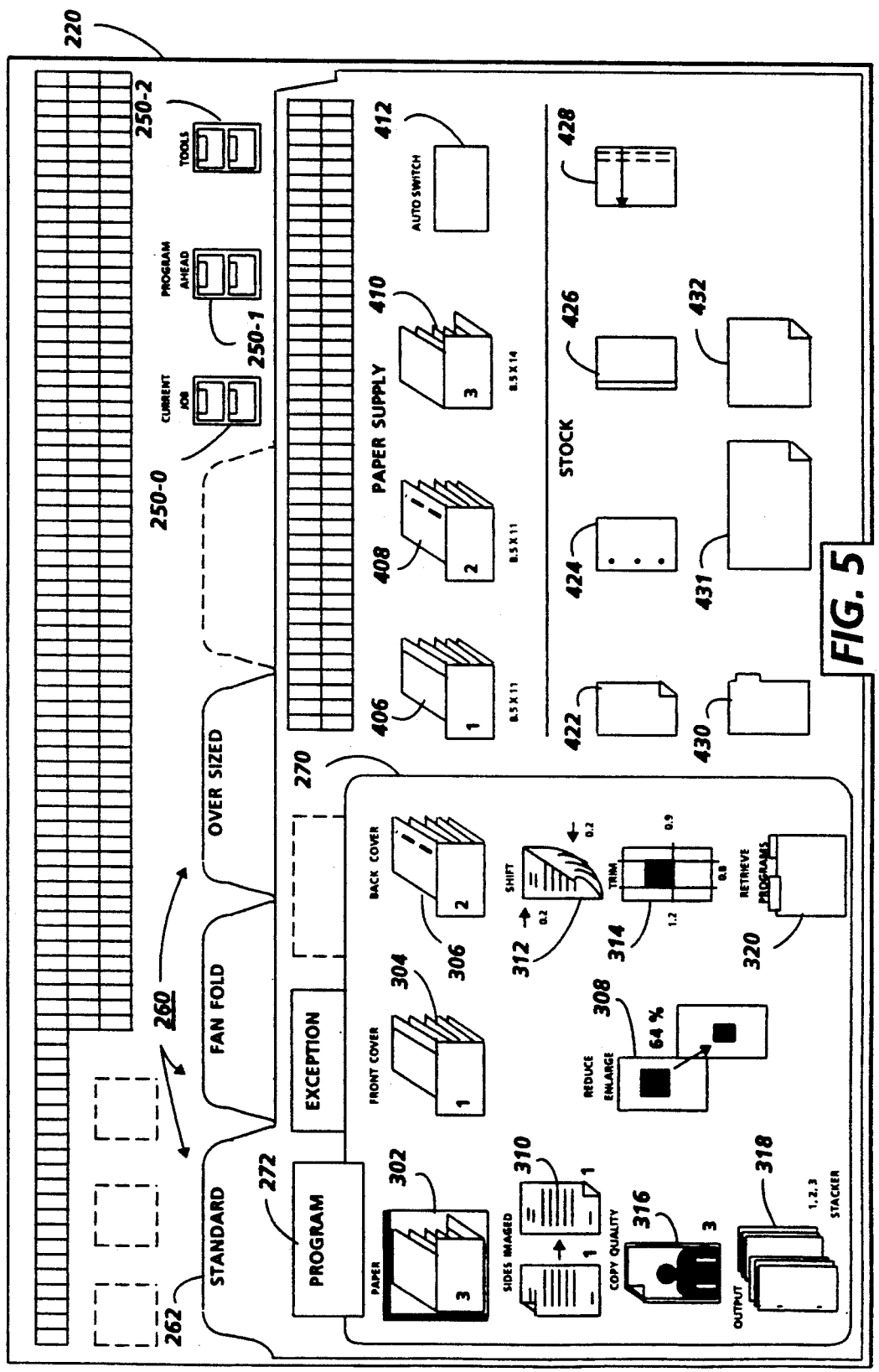
FIG. 5 is a front view of the touch monitor screen depicting the touch selection icons that are displayed in the work area as a result of touch selection of the PAPER icon on the PROGRAM scorecard.

In cases where an unselected feature that is not selectable is touched, a message will be displayed in the programming conflict area 246 of screen 220. The CURRENT JOB, PROGRAM AHEAD, and TOOLS states are entered by pressing the soft touch buttons 250-0, 250-1 and 250-2 respectively displayed on screen 220 in the Dialogue Mode Selection area 234 as shown in FIG. 5.

Assume the user interface to be in the CURRENT JOB state as a result of actuation of soft touch button 250-0. The functions of this state are to inform the operator of the daily tasks that are necessary to keep machine 5 in good working order, to allow the operator to program feature selections for the current job, and to allow the operator to run a copying job. The CURRENT JOB state is sub-divided into three cases: (1) "Job Complete", (2) "Print", and (3) "Job Incomplete". "Job Complete" implies that a job is not in progress and has been completed, "Print" refers to a job in progress, and "Job Incomplete" refers to a job in progress that has either voluntarily or involuntarily been stopped or interrupted. "Job Complete" is defaulted to except for the "Print" case.

The CURRENT JOB state can exit to the PROGRAM AHEAD state by touching the PROGRAM AHEAD button 250-1 in any of the "Job Complete", "Job Incomplete" or "Print" cases; or can exit to the INFORMATION state by pressing the "i" hard button on bezel 218; or can exit to the TOOLS state by touching the TOOLS soft touch button 250-2 in either the "Job Complete" or "Job Incomplete" cases. In addition the CURRENT JOB state will automatically enter the FAULT state when a fault occurs.

Figure 6:
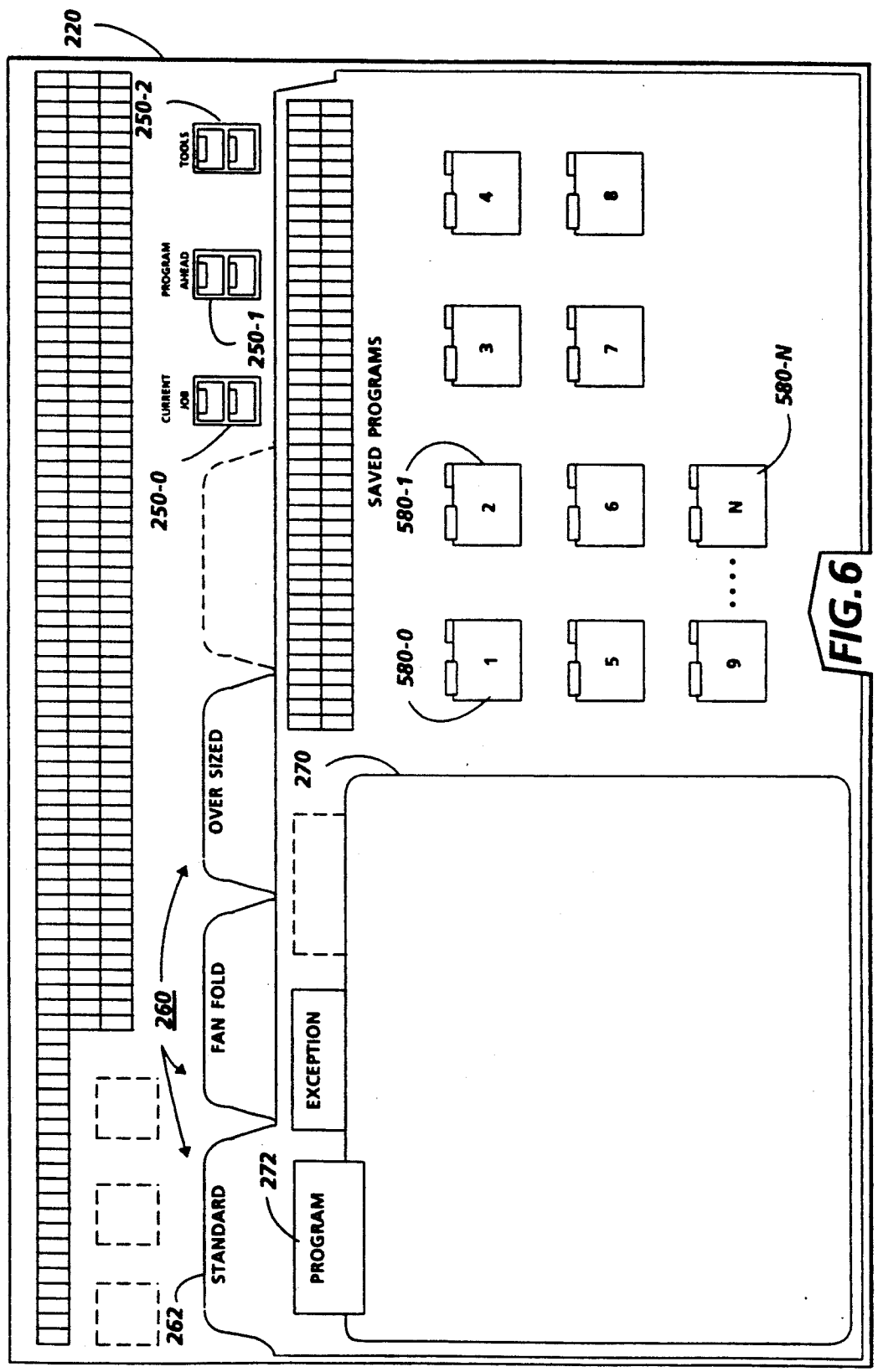
FIG. 6 is a front view of the touch monitor screen depicting the touch selection icons that are displayed in the work area as a result of touch selection of the RETRIEVE PROGRAMS icon on the PROGRAM scorecard.

When entered in the CURRENT JOB state, the dialogue pathway file folders 260 tabbed STANDARD, OVERSIZED, and FANFOLD are displayed providing various dialogue pathway selections in the form of scorecards 270. The function and the behavior of these tabbed file folders within the dialogue pathway selection area 236 for the "Job Complete", "Job Incomplete", and "Print" cases are as follows:

In the "Job Complete" case, this file folder provides standard programming options. As seen in FIG. 6, the PROGRAM scorecard 270 is displayed with the following icons presented for selection to the operator: PAPER 302, FRONT COVER 304, BACK COVER 306, REDUCE/ENLARGE 308, TRIM 310, SHIFT 312, SIDES IMAGED 314, COPY QUALITY 316, OUTPUT 318, and RETRIEVE PROGRAMS 320. The EXCEPTION scorecard is also available with this file folder. The "Job Incomplete" and "Print" cases are inactive. It should be understood that a different one of the dialogue pathway file folders available during operation in the CURRENT JOB state may be selected by touching the tab of the file folder desired. Further, it will be understood that each of the file folders 260 includes one or more scorecards 270 with available programming selections in the form of icons, some or all of which may be the same or different from the ones discussed hereinbelow.

For a more detailed description, reference is made to pending application Ser. No. 07/164,365 filed Mar. 3, 1988 and incorporated herein.

Figure 7:
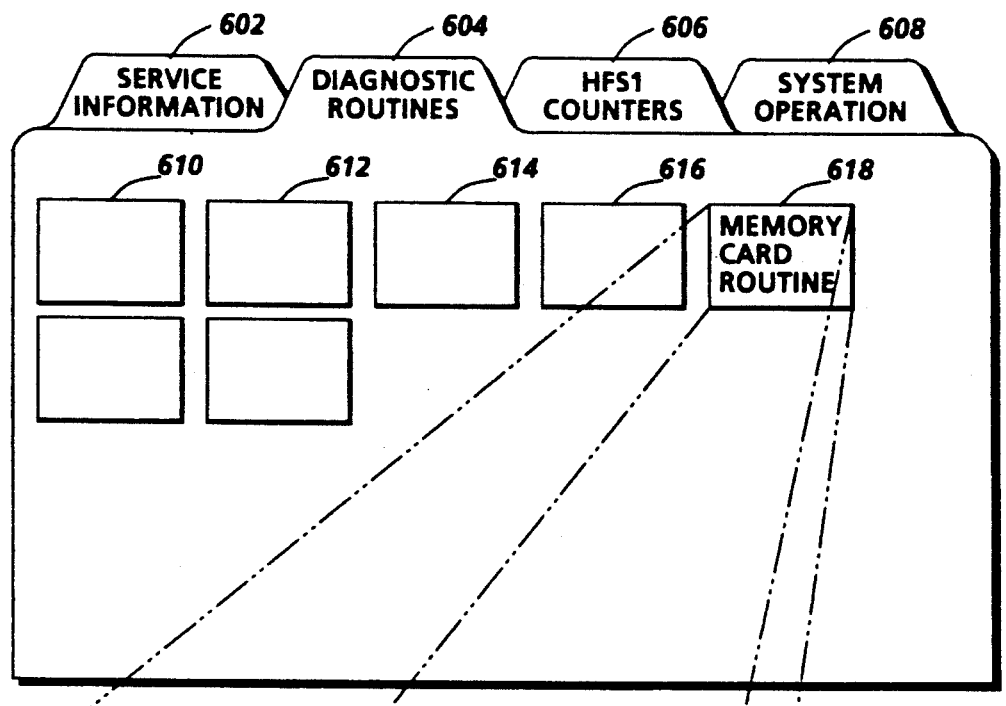
FIG. 7 is a front view of the touch monitor screen depicting the touch selection icons that are displayed in the work area to initiate memory card features in accordance with the present invention.

With reference to FIG. 7, there is disclosed a typical screen frame for use with the memory card features of the present invention. Along the top of the frame are tabs 602, 604, 606, and 608 illustrating service information, diagnostic routines, counters, and system operation. Soft buttons 610, 612, 614, and 616 provides access to various diagnostic routines and in particular soft button 618 provides access to the memory card features. Upon activation of the soft buttons 618, the system control responds with various memory card routines or features available to the operator and illustrated on the display screen as shown in FIG. 8.

Figure 8:
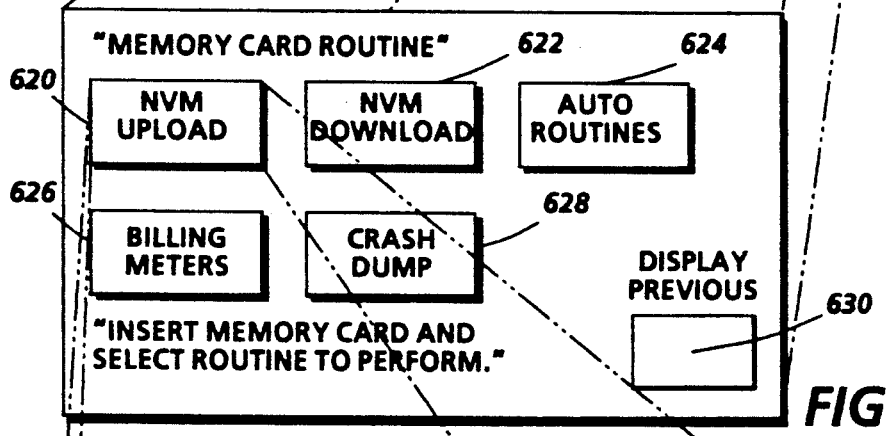
FIG. 8 is a front view of the touch monitor screen depicting the touch selection icons options available to a key operator in accordance with the present invention.

With reference to FIG. 8, there are shown a non-volatile memory upload soft button 620, a non-volatile memory down load soft button 622, and auto routines button 624, billings meter button 626 and crash dump soft button 628. A typical display previous frame button 630 is also provided. The soft button display buttons provide various options to the operator in taking advantage of the memory cards. Typically, in imager production machines, there is often data unique to each particular machine that is recorded in non-volatile memory. Thus, when a non-volatile memory initialization must be performed, all this machine unique information has to be re-entered into the non-volatile memory. This process takes a significant amount of time and generally the only way to circumvent this task is to remove the non-volatile memory board from the machine to be reloaded. This is particularly true during the machine test of a machine by technicians.

In accordance with the present invention, a memory card can store non-volatile data from the machine. This data can then be taken to a remote diagnostic site for full evaluation. The loading of the memory card with the non-volatile memory data is rapid and does not affect the current non-volatile memory contents. The same card could then be loaded with data and downloaded to the machine to test the affect of changing certain machine sensitive parameters. In addition, the whole content of the non-volatile memory does not have to be loaded when a memory exchange occurs. Only certain categories of non-volatile data such as machine unique data can be selectively downloaded and saved. Other non-volatile memory related information can also be downloaded to the machine while it is in the field. For example high frequency service item thresholds on machines frequently change over the course of machine operation. The memory card can download new thresholds quickly and easily. Again, with reference to FIG. 8, assuming the operator desires to upload machine data to a memory card, the operator engages the soft button 620 non-volatile memory upload. Upon selecting the soft button 620, the control will provide various options to the operator as displayed on the screen illustrated at FIG. 9.

It should be noted that although specific reference has been made to non-volatile memory, the scope of the present invention extends to sources of digital data other than non-volatile memory. Thus, it is contemplated within the present invention to apply the memory card techniques to any digital information to or from any digital source such as memory devices, input devices through ports, and analogue to digital converters.

Figure 9:
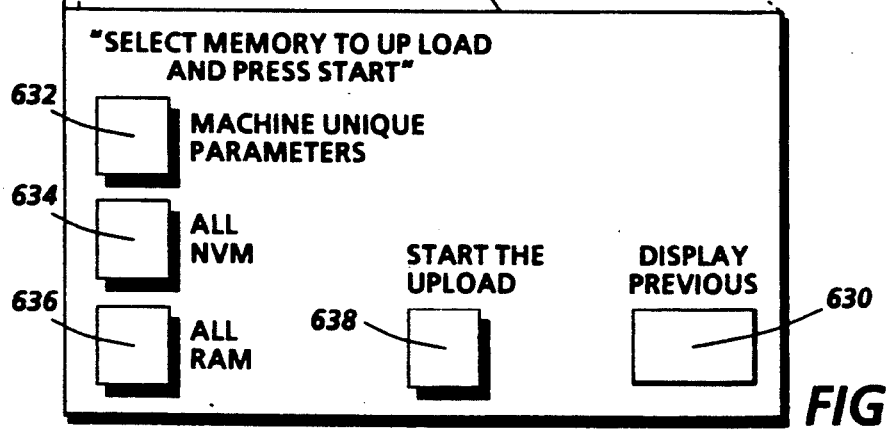
FIG. 9 is a front view of the touch monitor screen depicting the touch selection options available in a NVM upload mode in accordance with the present invention.

With reference to FIG. 9, the operator is provided with the options to load the memory card with machine unique parameters as illustrated by the soft button 632, loading all the non-volatile memory by use of the soft button 634, and loading all of the random access memory by selection of the soft button 636. Assuming that a memory card has been suitably loaded into the slot 637 on the display screen as illustrated in FIG. 3, the operator then engages button 638 to begin the upload procedure. At this time all the information from the designated memory will be loaded onto the memory card when then can be removed from the machine and transported to any suitable work station location for analysis of the data and information. It should also be noted that suitable identifiers or addresses are provided with the information that is uploaded from a particular memory to the memory card. This enables the control to immediately respond once the memory card is reloaded into the machine to recognize the location back into which the data and information is to be reloaded. Again, with reference to FIG. 8, if the operator wishes to download information to the non-volatile memory, soft button 622 is activated which will provide a screen display as shown in FIG. 10. As illustrated in FIG. 10, the operator merely engages the start button 638 to begin the download data procedure, that is, the reading of the memory card and the loading of the specified addresses in the machine memory with the data from the memory card.

In accordance with another feature of the present invention machine crashes defined as an automatic machine control reboot are normal in the design and development of a machine as well as during the machine operation itself. The causes of the crashes are frequently difficult to determine. Yet, data exists in the machine to give insight into the cause of the crash. The key is to efficiently capture this information for analysis. By the use of the memory card and the activation of the soft button crash dump, 628 as shown in FIG. 8, it is possible to capture the crash in formation onto the memory card for future analysis and diagnosis.

In accordance with another aspect of the present invention, the memory card is a memory bank to hold pre-programmed diagnostic routines, such as process control set ups, copy handling calibration, test pattern generation and magnification adjustment. In a process similar to described above with reference to the non-volatile upload, by selecting the auto routines button 624 as shown in FIG. 8, the key operator can have access to a plurality of diagnostic routines to troubleshoot the machine without the necessity of requesting a service representative. It should be noted that it is well within the scope of the present invention to tailor the type of diagnostic routines available to the key operator to the experience and training level of the key operator. A greater number of diagnostic routines as well as a much more complex set of diagnostic routines could be made available to a very experienced key operator and only a limited and relatively simple number of diagnostic routines available to a relatively experienced operator.

By selecting the auto routines button 624, a not shown display can make available various routine options available on that particular machine to that particular operator. By selecting the appropriate diagnostic routine and with suitable prompts and messages the operator is directed into the performance of the selected routine. By use of directive diagnostics, the operator is relieved of cumbersome documentation that is normally left at customer sites to perform diagnostics, since this information is now programmed into the memory card. It should also be noted that the memory card can also be used by the service representative or tech rep to perform complicated diagnostics and eliminates the need the tech rep to refer to cumbersome documentation that is now programmed onto the memory card.

In accordance with another aspect of the present invention, the memory card is adapted to be programmed remotely over telephone line. The memory card can thus be used at a customer site by appropriately signaling the key operator. With the capability of displaying text and figures on the user interface, the memory card can instruct the operator to perform tasks step by step. The only requirement is that the operator insert the memory card into the card slot. The display with appropriate messages then instructs the operator as required.

While the invention has been described with reference to the structure disclosed, it is not confined to the details set forth, but is intended to cover such modifications or changes as may come within the scope of the following claims.

I claim:

1. In an image processing apparatus having image processing means for forming an image, a controller for directing the operation of the image processing means, the operation of the image processing means being enabled by the set-up conditions of various machine elements, the controller including a memory for storing the image processing apparatus set-up conditions, a random access memory for storing controller crash data, a portable memory device, and a user interface with display, the method of saving and restoring the image processing apparatus set-up conditions and crash data comprising the steps of:

loading a portable memory device into the image processing apparatus, initiating a transfer of data from the memory to the portable memory device, recognizing a controller crash condition, and responding to the controller crash condition to initiate the transfer of data from the random access memory to the portable memory device.

2. The method of claim 1 including the step of re-storing the set-up conditions from the portable memory device to the non-volatile memory of the controller.

3. The method of claim 1 wherein the portable memory device is a memory card.

4. In an image processing apparatus having image processing means for forming an image, a controller for directing the operation of the image processing means, the controller including a portable memory device, a memory for storing image processing apparatus set-up parameters, and a user interface with display, the method of saving and restoring the image processing apparatus set-up parameters after machine adjustment comprising the steps of:

placing the controller in a save the image processing apparatus set-up parameters mode, activating the save set-up parameters mode to save the set-up parameters on the portable memory device, adjusting the apparatus causing a deviation of the set-up parameters, placing the controller in a restore the image processing apparatus set-up parameters mode, and restoring the set-up parameters from the portable memory device to the memory storing set up parameters.

5. The method of claim 4 wherein the step of activating the save set-up parameters mode to save the set-up parameters includes the step of transferring the set-up parameters from the memory of the controller to the portable memory device.

6. The method of claim 5 wherein the mass memory device is a memory card the memory is a non volatile memory, and the step of placing the controller in a save the image processing apparatus set-up parameters mode includes the step of loading the memory card into the image processing apparatus.

7. In an image processing apparatus having image processing means for forming an image, a controller for directing the operation of the image processing means, the controller including a portable memory device, a memory for storing the image processing apparatus set-up parameters, and a user interface, the method of saving the image processing apparatus set-up parameters comprising the steps of:

placing the controller in a save the image processing apparatus set-up parameters mode, displaying a save set-up parameters indicator at the user interface of the controller, activating the save set-up parameters indicator at the user interface to initiate the save set-up parameters operation, and transferring the set-up parameters from the memory onto the portable memory device.

8. In a control system for an image processing apparatus having a plurality of diagnostic procedures, the diagnostic procedures being selectively stored on a portable memory device of the image processing apparatus, the method of providing predetermined diagnostic procedures to an operator comprising the steps of:

preparing a portable memory device with predetermined diagnostic procedures, permitting a given operator access to said portable memory device with predetermined diagnostic procedures, and providing access to said portable memory device by said given operator.

9. The method of claim 8 wherein the step of providing access to said portable memory device includes the step of requiring an access code to predetermined diagnostic procedures.

10. The method of claim 8 wherein the step of providing access to said portable memory device includes the step of authorizing access to said portable memory device.

11. In an image processing apparatus having image processing means for forming an image; means for displaying information relating to image formations; a memory medium capable of storing a plurality of programs for controlling the image processing means, each of the programs providing a discrete diagnostic configuration in order that the apparatus operate in accordance with a selected one of the diagnostic configurations, the memory medium being removably provided in said image processing apparatus; the method of selectively providing diagnostics to the image processing apparatus comprising the steps of:

loading said memory medium into the image processing apparatus, the image processing apparatus including a screen having a touch responsive means to enable programming selections touched to be identified on said screen simulating a card file having plural primary file cards, each of said primary file cards when opened displaying a relatively smaller second card file with plural secondary file cards and adjacent work area, each of said secondary file cards when opened displaying discrete first level program touch selections for programming different machine diagnostic features, each of said primary and secondary file cards having a projecting touch tab for opening said file cards, said touch tabs having data to identify the file card subject matter;

programming the memory medium to provide said plurality of diagnostic configurations;

selecting a desired one of said stored diagnostic configurations to diagnose the machine in accordance with the selected configuration including the steps of:

touching selected tabs to open a selected one of each of said primary and secondary file cards to display first level program touch selections associated with said selected primary and secondary file cards, and touching one of said first level program selections displaying second level touch program selections in said work area for use in programming said machine.

* * * * *